United States Patent

Essi, III

(10) Patent No.: US 9,347,999 B2
(45) Date of Patent: May 24, 2016

(54) METHODS AND SYSTEMS FOR WARNING USERS OF A DEGRADED BACKUP CAPACITY IN BATTERY PLANTS

(71) Applicant: Emerson Network Power, Energy Systems, North America, Inc., Warrenville, IL (US)

(72) Inventor: David Ferris Essi, III, Amherst, OH (US)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 478 days.

(21) Appl. No.: 13/827,041

(22) Filed: Mar. 14, 2013

(65) Prior Publication Data

US 2014/0266226 A1    Sep. 18, 2014

(51) Int. Cl.
    *H02J 7/00* (2006.01)
    *G01R 31/36* (2006.01)

(52) U.S. Cl.
    CPC ........ *G01R 31/3682* (2013.01); *G01R 31/3679* (2013.01); *G01R 31/3624* (2013.01)

(58) Field of Classification Search
    USPC .......................................... 320/132; 324/429
    See application file for complete search history.

(56) References Cited

U.S. PATENT DOCUMENTS

| | | |
|---|---|---|
| 5,321,627 A | 6/1994 | Reher |
| 5,631,540 A | 5/1997 | Nguyen |
| 5,661,463 A | 8/1997 | Letchak et al. |
| 6,211,654 B1 | 4/2001 | O'Sullivan |
| 6,532,425 B1 * | 3/2003 | Boost et al. ............... 702/63 |
| 6,928,371 B1 | 8/2005 | Roshau |
| 7,400,149 B2 | 7/2008 | Köster et al. |
| 8,483,983 B2 | 7/2013 | Shin |
| 8,558,712 B2 | 10/2013 | Fechalos et al. |
| 2005/0001627 A1 * | 1/2005 | Anbuky et al. ............ 324/427 |
| 2009/0174365 A1 * | 7/2009 | Lowenthal et al. ........ 320/109 |
| 2011/0068746 A1 | 3/2011 | Rocci et al. |

* cited by examiner

*Primary Examiner* — Samuel Berhanu
(74) *Attorney, Agent, or Firm* — Harness, Dickey & Pierce, P.L.C.

(57) ABSTRACT

A method of warning a user when a reserve time of a battery plant in a system is substantially degraded is disclosed. The method includes determining a baseline capacity for the battery plant by estimating the reserve time of the battery plant while the battery plant is installed in the system, subsequently determining a present capacity of the battery plant by estimating the reserve time of the battery plant while the battery plant is installed in the system, comparing the present capacity with the baseline capacity, and generating a warning when the baseline capacity exceeds the present capacity by more than a defined amount. Example embodiments of systems and control circuits configured to perform the methods are also disclosed herein.

20 Claims, 5 Drawing Sheets

METHODS AND SYSTEMS FOR WARNING USERS OF A DEGRADED BACKUP CAPACITY IN BATTERY PLANTS

FIELD

The present disclosure relates to methods and systems for warning users of a degraded backup capacity in battery plants.

BACKGROUND

This section provides background information related to the present disclosure which is not necessarily prior art.

Battery plants provide backup power to a load. Typically this occurs when a main power supply is not providing sufficient power to the load. A backup capacity of a particular battery plant is the amount of electric charge the battery plant can store. The backup capacity is typically dependent on the size of a load coupled to a particular battery plant, the health of a particular battery plant, etc. Over time, the backup capacity of a particular battery plant may degrade due to several factors including, for example, premature battery end-of-life, mechanical issues (e.g., loose battery straps, etc.), increase in load, etc.

SUMMARY

This section provides a general summary of the disclosure, and is not a comprehensive disclosure of its full scope or all of its features.

According to one aspect of the present disclosure, a method of warning a user when a backup capacity of a battery plant in a system is substantially degraded is disclosed. The method includes determining a baseline capacity for the battery plant by estimating a reserve time of the battery plant while the battery plant is installed in the system, determining a present capacity of the battery plant by estimating the reserve time of the battery plant while the battery plant is installed in the system, comparing the present capacity with the baseline capacity, and generating a warning when the baseline capacity exceeds the present capacity by more than a defined amount.

According to another aspect of the present disclosure, a system for warning a user when a backup capacity of a battery plant is substantially degraded is disclosed. The system includes a power plant and a control circuit coupled to the power plant. The power plant includes a main power supply for providing power to a load and a battery plant coupled to the main power supply. The battery plant includes one or more batteries for providing power to the load when the main power supply is inoperable. The control circuit is configured to determine a baseline capacity for the battery plant by estimating a reserve time of the battery plant while the battery plant is installed in the system, determine a present capacity of the battery plant by estimating the reserve time of the battery plant while the battery plant is installed in the system, compare the present capacity with the baseline capacity, and generate a warning when the baseline capacity exceeds the present capacity by more than a defined amount.

According to still another aspect of the present disclosure, a non-transitory computer readable medium is disclosed. The non-transitory computer readable medium has computer-executable instructions for storing computer-executable instructions for determining a baseline capacity for the battery plant by estimating a reserve time of the battery plant while the battery plant is installed in the system, determining a present capacity of the battery plant by estimating the reserve time of the battery plant while the battery plant is installed in the system, comparing the present capacity with the baseline capacity, and generating a warning when the baseline capacity exceeds the present capacity by more than a defined amount.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
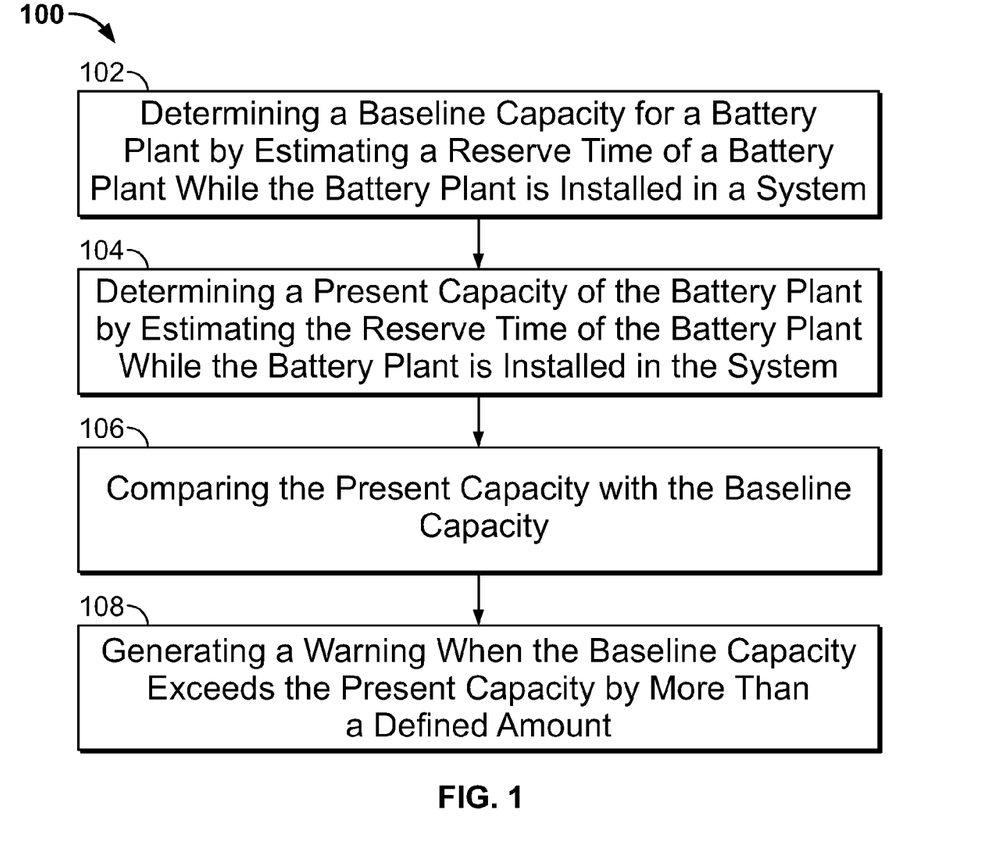
FIG. 1 is a block diagram of a method of warning a user when a backup capacity of a battery plant in a system is substantially degraded according to one example embodiment of the present disclosure.

A method of warning a user when a backup capacity of a battery plant in a system is substantially degraded according to one example embodiment of the present disclosure is illustrated in FIG. 1 and indicated generally by reference number 100. As shown in FIG. 1, the method 100 includes, in block 102, determining a baseline capacity for the battery plant by estimating a reserve time of the battery plant while the battery plant is installed in the system. The method further includes, in block 104, determining a present capacity of the battery plant by estimating the reserve time of the battery plant while the battery plant is installed in the system. In block 106, the present capacity and the baseline capacity are compared and, in block 108, a warning is generated when the baseline capacity exceeds the present capacity by more than a defined amount.

These estimations (to determine the baseline capacity and the present capacity) occur while the battery plant is installed in the system. For example, the estimations may occur while the battery plant is installed in a power plant, etc. In this way, both determining the baseline capacity and the present capacity of the battery plant occur while the battery plant is installed in the same system.

The baseline capacity of the battery plant may be determined in an initial period of time. For example, this initial period of time may be 183 days (e.g., about six months). Alternatively, the initial period of time may be more or less than 183 days. During this initial period of time, the reserve time may be estimated multiple times to determine a largest reserve time. The baseline capacity may then be determined from the largest reserve time, set to equal the largest reserve, etc. In some embodiments, the present capacity may be determined after this initial period of time has elapsed.

Additionally, the reserve time may be estimated while the battery plant is discharging. In some embodiments, the reserve time may be estimated after the battery plant has discharged for a period of time. For example, a voltage of the discharging battery plant may initially vary for a period of time. Waiting for this period of time may allow the voltage of the discharging battery to substantially stabilize before the reserve time is estimated. The period may be any suitable time, including for example, five minutes, twenty minutes, forty minutes, one hour, etc.

In the example of FIG. 1, the warning may be generated when the present capacity is less than N times the baseline capacity. N may be a value between zero and one (i.e., 0<N<1). For example, the warning may be generated when the present capacity is less than 0.8 times the baseline capacity.

As used herein, the backup capacity may mean a unit of electric charge (e.g., Amp-hour, Amp-minute, etc.) or a unit of time (e.g., a reserve time of the battery plant, etc.). Additionally, in some embodiments, the reserve time may be a time 'til empty (TTE) of the battery plant. Alternatively, the reserve time may be a time less than the TTE of the battery plant. Further, it should be apparent to one skilled in the art that the backup capacity (e.g., the electric charge, the reserve time, etc.) may decrease due to increased loading.

Figure 2:
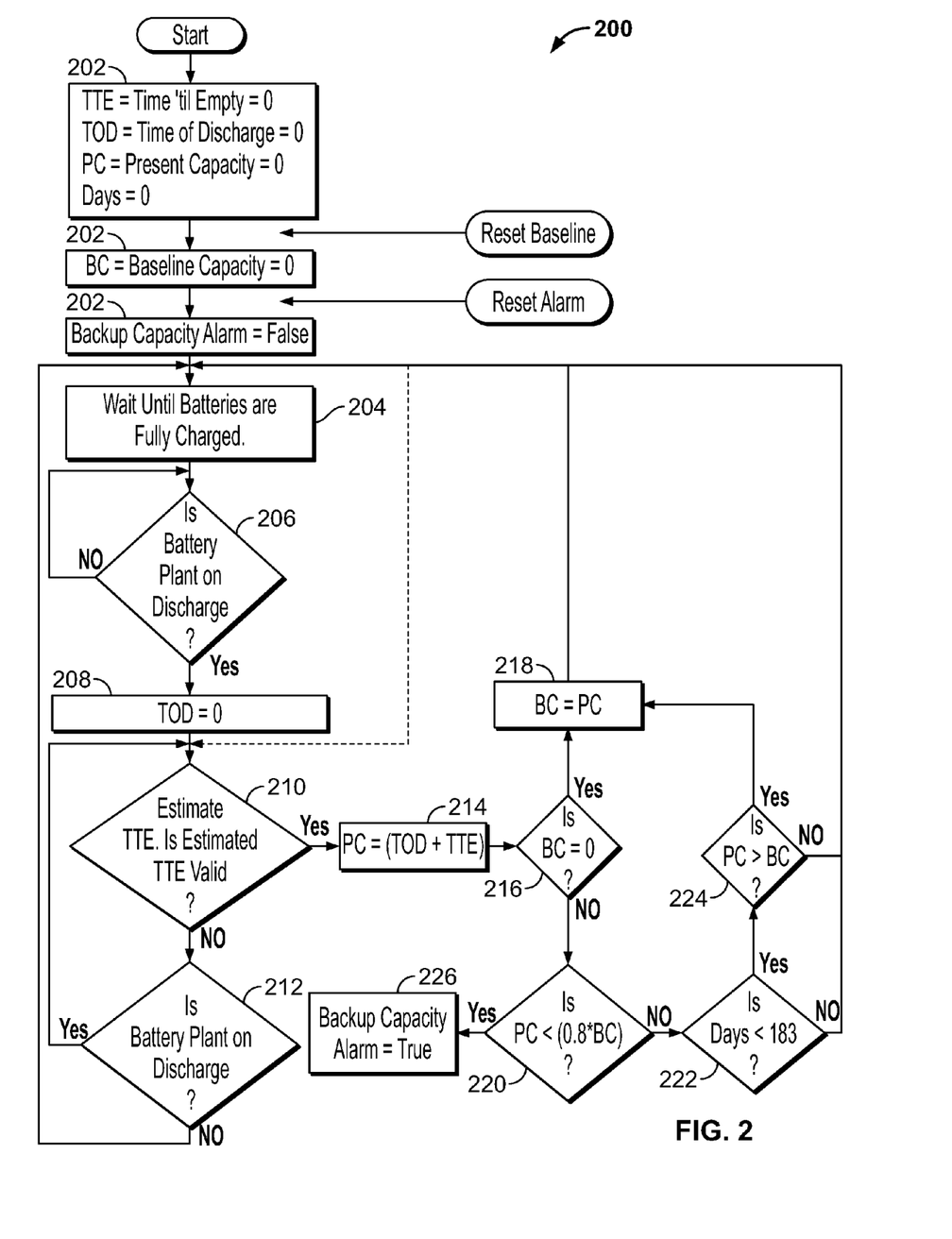
FIGS. 2 and 3 are flow charts of example methods of warning a user when a backup capacity of a battery plant is substantially degraded according to additional example embodiments.

FIG. 2 is a flow chart illustrating another example method 200 of warning a user when a backup capacity of a battery plant in a system is substantially degraded. In the example of FIG. 2, the reserve time is a TTE of the battery plant. As is generally shown in FIG. 2, the TTE of the battery plant may be estimated to determine a baseline capacity BC of the battery plant and a present capacity of the battery plant. Although FIG. 2 illustrates determining and employing the TTE of the battery plant, it should be apparent to one skilled in the art that the reserve time of the battery plant may be employed without departing from the scope of the disclosure.

Initially, as shown by reference number 202, the TTE of the battery plant, a time of discharge TOD, the present capacity PC, and the baseline capacity BC are all set to zero. Additionally, the backup capacity alarm is set to false. These values may not change or may change one or more times during the course of the method 200.

Next, a determination is made to whether the battery plant is fully charged (block 204). This may be determined, for example, by waiting a desired amount of time (e.g., twelve hours, etc.) after determining the battery plant is a half volt (0.5V) from a float voltage setting of the battery plant. After the battery plant is fully charged, a determination is made to whether the battery plant is discharging (e.g., providing power to a load, etc.). This is shown in block 206.

If the battery plant is discharging, the process ensures the time of discharge TOD is still set to zero (block 208). Then, as shown in block 210, the TTE may be estimated and validated. This validation may include, for example, waiting a period of time to allow the voltage of the discharging battery plant to substantially stabilize as explained above. Therefore, this would increase the time of discharge TOD. Alternatively and/or additionally, the validation may include comparing two or more TTE estimations to ensure the difference between the TTE estimations are within a defined percent. This ensures the estimated TTE used is reliable, etc.

If the estimated TTE is not valid, a determination is made to whether the battery plant is discharging (block 212). If the battery plant is not discharging, the process returns to determining if the battery plant is fully charged (block 204). If the battery is discharging, the process returns to estimating the TTE and validating this estimation (block 210).

If the estimated TTE is valid (block 210), the present capacity PC of the battery plant is calculated. In the example of FIG. 2, the present capacity is the time of discharge TOD plus the estimated TTE (block 214). In this way, the present capacity PC may be determined by the estimated TTE if, for example, the time of discharge TOD is zero. As shown in the example of FIG. 2, the present capacity is a unit of time.

Once the present capacity PC is calculated, the process determines if the baseline capacity BC is zero (as initially set). This is shown in block 216. If the baseline capacity BC is zero, the baseline capacity BC is set to the value of the present capacity PC (block 218). In this way, the baseline capacity BC is determined by the estimated TTE.

After setting the baseline capacity BC, the process returns to determining if the battery plant is fully charged (block 204). After the battery plant begins to discharge (block 206), the process again determines (and validates) the estimated TTE (block 210). Once the estimated TTE is validated, the present capacity PC is again calculated (block 214) as described above. In this way, the present capacity PC is subsequently determined by the estimated TTE as explained above.

Alternatively, after setting the baseline capacity BC in block 218, the process may return to block 210 to again determine (and validate) the estimated TTE. This is shown by the dashed line in FIG. 2.

If the baseline capacity BC is not zero (e.g., because the baseline capacity BC has already been set, etc.), the subsequent value of the present capacity PC (calculated in block 214) is compared with the baseline capacity BC times a value N (block 220). In the example of FIG. 2, the value N is 0.8. Alternatively, N may be any suitable value greater than zero and less than 1 (i.e., 0<N<1).

If the present capacity is greater than or equal to the baseline capacity BC times 0.8, a determination is made to whether a period of time has elapsed since the battery plant was installed in the system. This is shown in block 222. In the example of FIG. 2, this period of time is 183 days (e.g., about six months). In some embodiments, the system may include a control circuit having a clock, etc. to track the elapsed days. If 183 days has elapsed, the process returns to determining if the battery plant is fully charged (block 204) and proceeds as explained above. Alternatively, the process may return to block 210 to again determine (and validate) the estimated TTE as explained above.

Alternatively, if 183 days has not elapsed (i.e., the battery plant has not been installed in the system for 183 days), the process determines if the subsequent present capacity PC is greater than the baseline capacity BC. This is shown in block 224. If the subsequent present capacity PC is less than or equal to the baseline capacity BC, the process returns to determining if the battery plant is fully charged (block 204) and proceeds as explained above. Alternatively, the process may return to block 210 to again determine (and validate) the estimated TTE as explained above.

If the subsequent present capacity PC is greater than the previously set baseline capacity BC, the subsequent present capacity PC is set to equal the baseline capacity BC (block 218). Thus, the subsequent present capacity PC replaces the previously set baseline capacity BC. In this way, the baseline capacity BC determination may occur one or more times during the 183 days. Accordingly, as shown in FIG. 2, the TTE may be estimated multiple times (block 210) and the largest TTE may be used to set the baseline capacity BC.

Referring back to block 220, if the present capacity PC is less than the baseline capacity BC times 0.8, the backup capacity alarm is set to true (block 226). This generates a warning to notify the user that the backup capacity of the battery plant may be substantially degraded. For example, the backup capacity of the battery plant may be substantially degraded due to end-of-life of one or more batteries in the battery plant, loose battery straps, increased loads, etc.

The backup capacity alarm may be an audible alarm, a visual alarm, etc. Alternatively and/or additionally, the warning may include any suitable alarm, electronic notification, etc.

Figure 3:
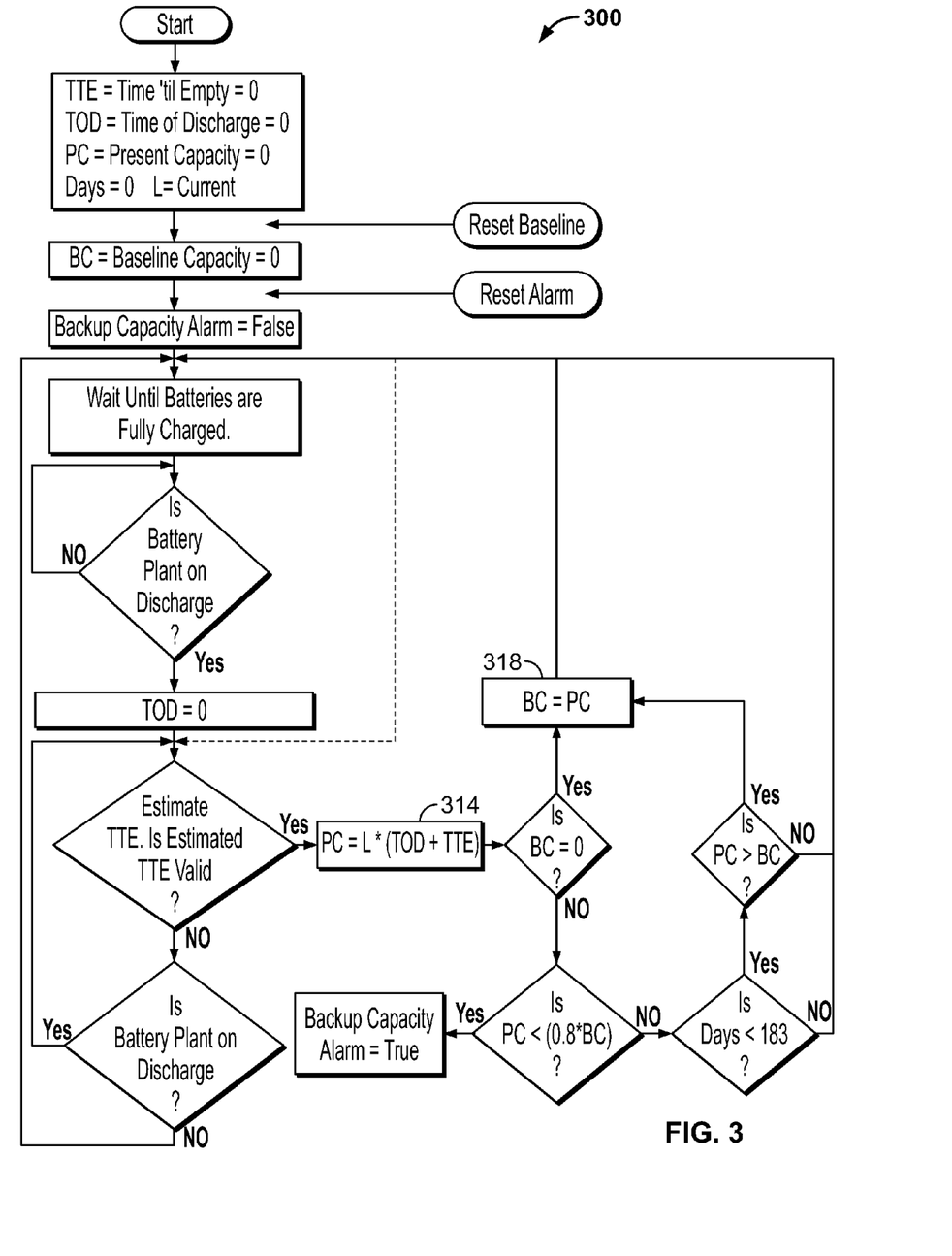

FIG. 3 illustrates another example embodiment of a flow chart illustrating a method 300 of warning a user when a backup capacity of a battery plant is substantially degraded. The example of FIG. 3 is substantially similar to the example of FIG. 2. However, a present capacity PC and a baseline capacity BC are in a unit of electric charge (e.g., Amp-hours, Amp-minutes, etc.).

For example, in block 314, the present capacity PC is determined by adding a time of discharge TOD to an estimated TTE and then multiplying that value by an output current of the battery plant. Therefore, the present capacity PC is a unit of electric charge. In addition, as shown in block 318, the baseline capacity BC is set to equal the present capacity PC or a subsequent present capacity PC based on a largest TTE as explained above. Therefore, the baseline capacity BC of the example of FIG. 3 is also a unit of electric charge.

The estimated reserve time of FIG. 1 and the estimated TTE of FIGS. 2 and 3 may be obtained in any suitable manner. For example, the TTE may be estimated by employing the Peukert equation, discharge curves, etc.

Preferably, the reserve time and the TTE are estimated by sensing a parameter of the system. The sensed parameter may be one or more parameters, including a sensed battery plant voltage, a sensed output current, etc. In other embodiments, the sensed parameter only includes the sensed battery plant voltage or only includes the sensed output current. Additionally, because the sensed parameter may be the sensed battery plant voltage and/or the sensed output current, the reserve time and the TTE may be estimated without sensing, measuring, calculating, knowing, etc. a characteristic of each battery of the battery plant (if the battery plant includes more than one battery) and/or a load coupled to the battery plant.

The parameter may be sensed multiple times over a period of time. This information may then be used generate a linear equation to determine the reserve time and/or the TTE. For example, a battery plant voltage (V) of a system including a battery plant may be sensed multiple times over a period of time (T) and a change in the voltage over the period of time ($\Delta V/\Delta T$, i.e., the slope) may be measured, calculated, etc. If a predetermined cutoff voltage (Vc) is known (e.g., 42V), a time (t) to discharge from the battery plat voltage (V) to the predetermined cutoff voltage (Vc) may be calculated using the equation $V-Vc=\Delta V/\Delta T^*t$. This time (t) may then be divided by a value (e.g., two, three, five, etc.) to obtain the estimated TTE for the battery plant. Preferably, the time (t) is divided two.

Figure 4:
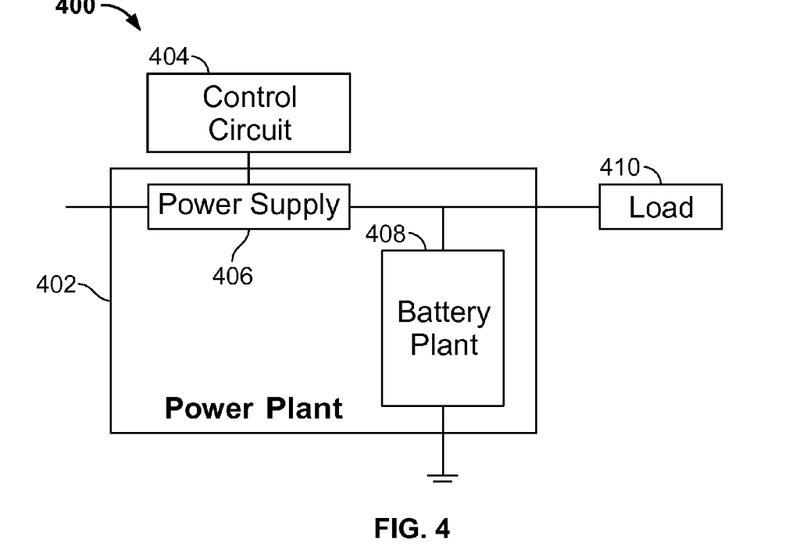
FIGS. 4-6 are block diagrams of example systems including control circuits for employing methods of warning a user when a backup capacity of a battery plant is substantially degraded according to further example embodiments.
Figure 5:
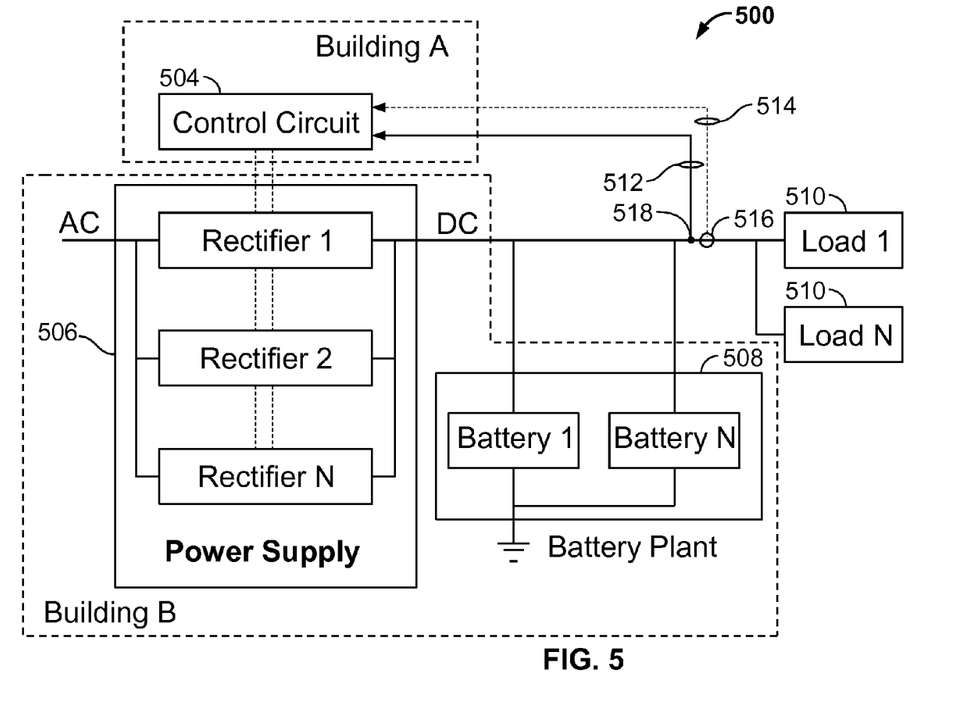
Figure 6:
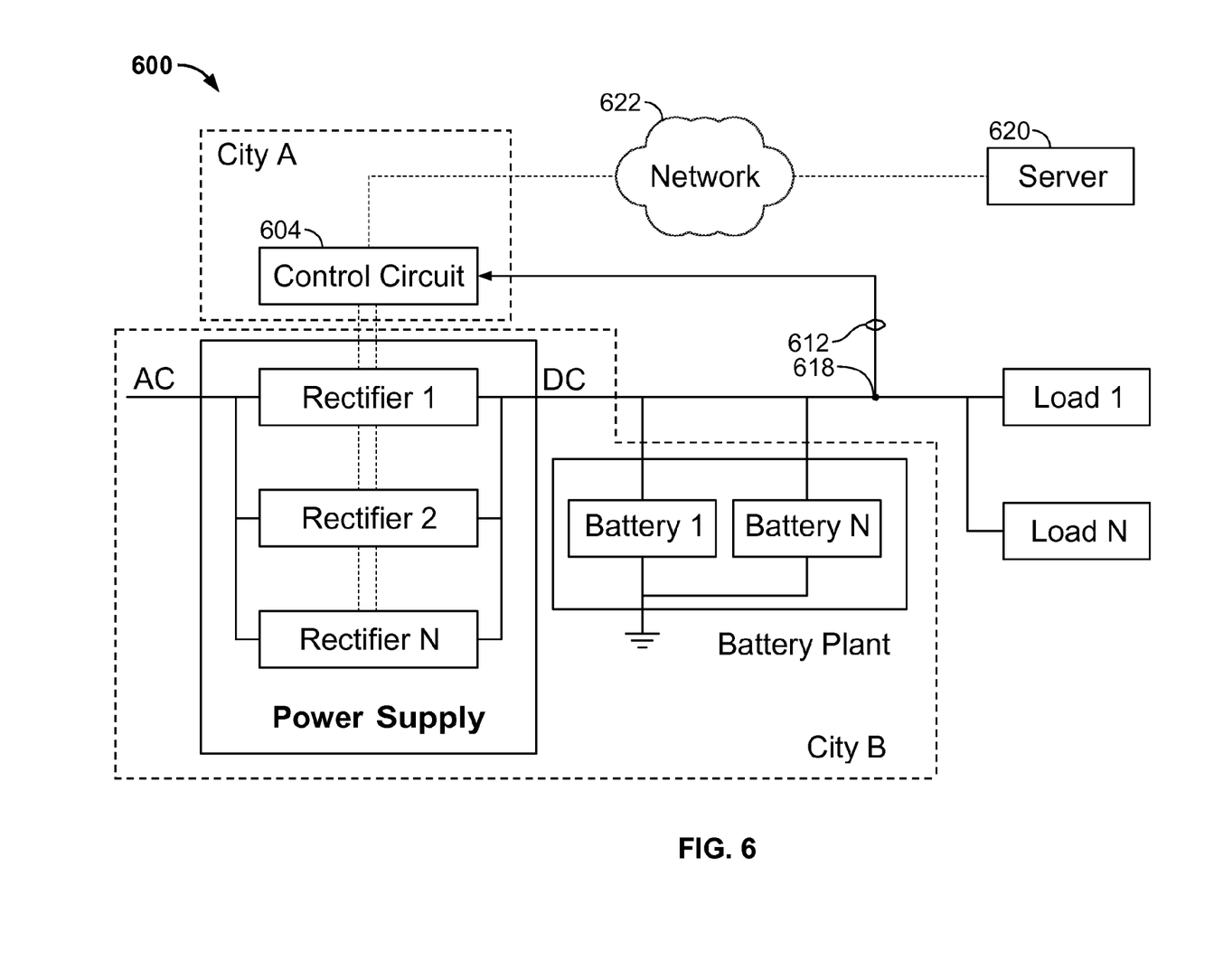

FIGS. 4-6 illustrate example systems including a control circuit for employing the methods described herein. For example, the control circuits of FIGS. 4-6 may include instructions to perform the method 100 FIG. 1, the method 200 of FIG. 2 and/or the method 300 of FIG. 3.

As shown in FIG. 4 a system 400 includes a power plant 402 and a control circuit 404 coupled to the power plant 402. Although the control circuit 404 is shown outside the power plant 402, the control circuit 404 may be internal to the power plant 402.

The power plant 402 includes a main power supply 406 for providing power to a load 410. The main power supply 406 may include any suitable electrical device including, for example, one or more rectifiers, one or more DC-DC converters, inverters, etc.

The power plant 402 further includes a battery plant 408 coupled to the main power supply 406. The battery plant 408 may include a battery for providing power to the load 410 when the main power supply 406 is inoperable. For example, the main power supply 406 may be inoperable when the main power supply 406 is offline, etc. Preferably, the battery plant 402 is able to provide backup power for extended periods of time, including for at least three hours.

Alternatively, the battery plant 402 may include more than one battery coupled in parallel, a battery string including more than one battery, battery strings including more than one battery coupled in parallel, etc. for providing power to the load 410 when the main power supply 406 is inoperable.

The battery (or batteries) of the battery plant 408 may be charged by the main power supply 406. Alternatively and/or additionally, the battery (or batteries) of the battery plant 408 may be charged by another source within the power plant 402 or exterior to the power plant 402.

As described above, the control circuit 404 may include instructions to perform the methods described herein. For example, the control circuit 404 may determine a baseline capacity for the battery plant 408 by estimating a reserve time of the battery plant 408, determine a present capacity of the battery plant 408 by estimating the reserve time of the battery plant 408, compare the present capacity with the baseline capacity and generate a warning when the baseline capacity exceeds the present capacity by more than a defined amount.

The control circuit 404 may perform the methods described herein without monitoring (e.g., characterizing, storing data, etc.) the load 410 or measuring parameters of individual batteries in the battery pack 408. In this way, the methods may be performed by sensing the battery plant voltage and/or output current without monitoring the load 410, measuring a voltage and/or current of each battery of the battery pack 408, etc.

The load 410 may be a DC load or an AC load. For example, if the load is an AC load, the system 400 would further include an inverter coupled on an output side of the battery plant 408 and/or the power plant 402.

FIG. 5 illustrates another example system 500 including a power supply 506, a battery plant 508 and a control circuit 504. The power supply 506 is coupled to one or more DC loads 510 and the battery plant 508. As shown in FIG. 5, the power supply 506 includes one or more rectifiers for converting an AC current and voltage to a DC current and voltage. The battery plant 508 is coupled to the load 510 and the power supply 506. The battery plant 508 includes one or more batteries for providing power to the load 510 when the power supply 506 is inoperable.

The system 500 may further include one or more sensors for sensing a parameter of the system 500 to perform the methods described herein (e.g., the method 300 of FIG. 3). In the example of FIG. 5, the system 500 includes a voltage sensor 518 for sensing a battery plant voltage and/or a current sensor 516 (indicated by a dashed line) for sensing an output current. As shown in FIG. 5, the control circuit 504 receives a signal 512 representing the battery plant voltage and a signal 514 representing the output current.

Additionally, the system 500 may include instructions to perform the method 300 described above. This is because the system 500 includes the voltage sensor 518 to sense the battery plant voltage and the current sensor 516 to sense the output current. Therefore, the control circuit 504 may employ the battery plant voltage to estimate the TTE and/or reserve time, and the output current to calculate the present capacity PC (and therefore set the baseline capacity BC) in a unit of electric charge as explained above. Accordingly, the control circuit 504 may determine the baseline capacity BC and the present capacity PC from the estimated TTE and/or reserve time and the sensed output current.

FIG. 6 is a system 600 substantially similar to the system 500 of FIG. 5. The system 600 includes a control circuit 604 that receives a signal 612 representing a battery plant voltage via a voltage sensor 618. In this way, the battery plant voltage is the only sensed parameter employed by the system 600 to perform the methods described herein (e.g., the method 200, etc.). For example, the control circuit 604 may employ the battery plant voltage to estimate the TTE and/or reserve time and then use this estimation to calculate the present capacity PC (and therefore set the baseline capacity BC) in a unit of time as explained above.

The system 600 may further include a server 620 coupled to the control circuit 604 via a network 622. The network 622 may include a wireless and/or a wired internet, intranet, etc. connection. The server 620 may include a processing unit having instructions to perform some or all of the elements of each method described herein. Alternatively, the control circuit 604 may include instructions to perform some or all of the elements of each method.

The server 620 may employ a polled operation where the server 620 polls the system 600 (e.g., the control circuit 604) for a sensed parameter (e.g., the battery plant voltage and/or an output current). Alternatively, the server 620 may employ a pushed operation where the system 600 (e.g., the control circuit 604) pushes the sensed parameter to the server without a request from the server 620.

The control circuits and/or the servers disclosed herein may be remote to the power plants disclosed herein. For example, the control circuit and/or the server may be positioned in one city (e.g., city A of FIG. 6) and the power plant may be positioned in a different city (e.g., city B of FIG. 6). Additionally and/or alternatively, the control circuit and/or the server may be positioned in one building (e.g. building A of FIG. 5) and the power plant may be positioned in a different building (e.g., building B of FIG. 5).

The control circuits and/or the servers may perform one or more of the methods disclosed herein continuously. Alternatively, the control circuits and/or the servers may perform the methods periodically, including for example, daily, semi-weekly, weekly, semi-monthly, monthly, etc.

Additionally, example methods disclosed herein may be implemented as computer-executable instructions. These computer-executable instructions may be stored on a non-transitory computer readable medium. In this way, the methods may be implemented in a computer program product stored on a computer readable medium. The computer readable medium may include for example, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems, including molecular memory ICs, or any type of system or device suitable for storing instructions and/or data.

By employing a control circuit to perform the methods described herein, costs and complexity of a warning system to warn of a degraded backup capacity in a particular battery plant may be reduced. This may be accomplished, for example, by reducing the number of sensing components needed to sense system parameters. Thus, the systems and methods disclosed herein may provide a reliable, inexpensive warning system that indicates a battery plant may need an inspection to identify a cause (e.g., loose battery straps, etc.) of the degraded backup capacity.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A method of warning a user when a backup capacity of a battery plant in a system is substantially degraded, the method comprising:
    determining a baseline capacity for the battery plant by estimating a reserve time of the battery plant while the battery plant is installed in the system a plurality of times during a period to generate a plurality of reserve times and using a largest reserve time of the plurality of reserve times to set the baseline capacity;
    determining a present capacity of the battery plant by estimating the reserve time of the battery plant while the battery plant is installed in the system;
    comparing the present capacity with the baseline capacity; and
    generating a warning when the baseline capacity exceeds the present capacity by more than a defined amount.

2. The method of claim 1 wherein using the largest reserve time of the plurality of reserve times to set the baseline capacity includes setting the baseline capacity to equal the largest reserve time.

3. The method of claim 2 wherein the period is about 183 days.

4. The method of claim 2 wherein determining the present capacity includes determining the present capacity after the period.

5. The method of claim 2 wherein generating includes generating the warning when the present capacity is less than N times the baseline capacity, where 0<N<1.

6. The method of claim 5 wherein N is 0.8.

7. The method of claim 1 wherein the reserve time is a time 'til empty (TTE) of the battery plant.

8. The method of claim 1 wherein the battery plant includes one or more batteries.

9. The method of claim 1 wherein estimating includes estimating the reserve time of the battery plant while the battery plant is discharging.

10. A non-transitory computer readable medium storing computer-executable instructions for warning a user when a backup capacity of a battery plant in a system is substantially degraded, the instructions configured to determine a baseline capacity for the battery plant by estimating a reserve time of the battery plant while the battery plant is installed in the system a plurality of times during a period to generate a plurality of reserve times and using a largest reserve time of the plurality of reserve times to set the baseline capacity, determine a present capacity of the battery plant by estimating the reserve time of the battery plant while the battery plant is installed in the system, compare the present capacity with the baseline capacity, and generate a warning when the baseline capacity exceeds the present capacity by more than a defined amount.

11. A system for warning a user when a backup capacity of a battery plant is substantially degraded, the system comprising a power plant including a main power supply for providing power to a load and a battery plant coupled to the main power supply, the battery plant including one or more batteries for providing power to the load when the main power supply is inoperable, and a control circuit coupled to the power plant and configured to determine a baseline capacity for the battery plant by estimating a reserve time of the battery plant while the battery plant is installed in the system a plurality of times during a period to generate a plurality of reserve times and using a largest reserve time of the plurality of reserve times to set the baseline capacity, determine a present capacity of the battery plant by estimating the reserve time of the battery plant while the battery plant is installed in the system, compare the present capacity with the baseline capacity, and generate a warning when the baseline capacity exceeds the present capacity by more than a defined amount.

12. The system of claim 11 further comprising a sensor coupled to the power plant, the sensor configured to sense a parameter of the system to estimate the reserve time.

13. The system of claim 12 wherein the sensed parameter is a sensed battery plant voltage or a sensed output current.

14. The system of claim 13 further comprising a sensor configured to sense an output current of the system, wherein the control circuit is configured to determine the baseline capacity and the present capacity from the estimated reserve time and the sensed output current.

15. The system of claim 14 wherein the main power supply includes a rectifier.

16. The system of claim 11 wherein the control circuit is positioned in a first city and the power plant is positioned in a second city different than the first city.

17. The system of claim 11 wherein the control circuit is positioned in a first building and the power plant is positioned in a second building different than the first building.

18. The system of claim 11 wherein the reserve time is a time 'til empty (TTE) of the battery plant.

19. The system of claim 11 wherein the control circuit is configured to set the baseline capacity to equal the largest reserve time.

20. The system of claim 19 wherein the control circuit is configured to determine the present capacity after the period.

* * * * *